United States Patent
Jinushi et al.

(10) Patent No.: US 9,246,076 B2
(45) Date of Patent: Jan. 26, 2016

(54) THERMOELECTRIC CONVERSION MODULE AND PRODUCTION METHOD THEREFOR

(71) Applicant: HITACHI POWDERED METALS CO., LTD., Matsudo-shi, Chiba (JP)

(72) Inventors: Takahiro Jinushi, Matsudo (JP); Zenzo Ishijima, Matsudo (JP)

(73) Assignee: HITACHI POWDERED METALS CO., LTD., Chiba (JP)

( * ) Notice: Subject to any disclaimer, the term of this patent is extended or adjusted under 35 U.S.C. 154(b) by 81 days.

(21) Appl. No.: 14/160,988

(22) Filed: Jan. 22, 2014

(65) Prior Publication Data

US 2014/0273325 A1    Sep. 18, 2014

Related U.S. Application Data

(62) Division of application No. 13/328,495, filed on Dec. 16, 2011, now abandoned.

(30) Foreign Application Priority Data

Dec. 24, 2010   (JP) ................. 2010-286930

(51) Int. Cl.
| H01L 21/00 | (2006.01) |
| H01L 35/34 | (2006.01) |
| H01L 35/08 | (2006.01) |

(52) U.S. Cl.
CPC ........... *H01L 35/34* (2013.01); *H01L 35/08* (2013.01)

(58) Field of Classification Search
CPC ............................. H01L 35/34; H01L 35/08
USPC ...................... 438/54; 136/201, 237
See application file for complete search history.

(56) References Cited

U.S. PATENT DOCUMENTS

| 6,368,704 B1 * | 4/2002 | Murata et al. ............. 428/323 |
| 2006/0118160 A1 * | 6/2006 | Funahashi et al. ........ 136/236.1 |
| 2011/0099991 A1 * | 5/2011 | Stefan et al. ............... 60/320 |

FOREIGN PATENT DOCUMENTS

| JP | A-09-293906  | 11/1997 |
| JP | A-2008-305987 | 12/2008 |
| JP | A-2009-302332 | 12/2009 |
| JP | A-2010-182940 | 8/2010 |

OTHER PUBLICATIONS

Sep. 2, 2014 Office Action issued in Japanese Patent Application No. 2010-286930 with English Translation.

* cited by examiner

*Primary Examiner* — Shaun Campbell
(74) *Attorney, Agent, or Firm* — Oliff PLC

(57) ABSTRACT

A production method for a thermoelectric conversion module having a thermoelectric conversion element and an electrode, which are metallurgically bonded together via a porous metal layer. The porous metal layer is made of nickel or silver and has a density ratio of 50 to 90%.

8 Claims, 3 Drawing Sheets

THERMOELECTRIC CONVERSION MODULE AND PRODUCTION METHOD THEREFOR

This is a Division of application Ser. No. 13/328,495 filed Dec. 16, 2011. The disclosure of the prior application is hereby incorporated by reference herein in its entirety.

BACKGROUND OF THE INVENTION

1. Technical Field

The present invention relates to a thermoelectric conversion module that converts thermal energy to electric energy, and relates to a production method therefor. The thermoelectric conversion module has a bonding portion between a thermoelectric conversion element and an electrode, and thermal stress may occur in the bonding portion. Therefore, specifically, the present invention relates to a thermoelectric conversion module with a function to decrease the thermal stress, and relates to a production technique therefor.

2. Background Art

A power generation system provided with a thermoelectric conversion module using thermoelectric conversion elements directly generates electricity. This power generation system has a simple structure and does not have a movable part, thereby having high reliability and facilitating maintenance thereof. However, the power generation system has low power density and low energy conversion efficiency. Due to this, this power generation system has been developed only for special uses at low output scale, such as for use in space. However, in view of recent environmental issues, this power generation system is expected to be useful as an environmental protection measure. For example, this power generation system is anticipated to be useful as a small-scale distributed power generation system that uses an exhaust heat source of a waste incinerator, a cogeneration system, etc. This power generation system is also anticipated to be useful as an automobile power generation system that uses heat in exhaust gas of automobiles. Consequently, reduction in the cost of this power generation and improvement in durability of a thermoelectric conversion module system are required in this power generation system.

A thermoelectric conversion module is shown in FIG. 1. As shown in FIG. 1, the thermoelectric conversion module is constructed by stacking an electrode 2 on each side of a thermoelectric conversion element 1. Moreover, each of a cooling duct 4 and a heating duct 5 is stacked on the rest side of each electrode 2 via an electric insulating layer 3. The electrode 2 may be made of copper, and the electric insulating layer 3 may be made of mica. In this thermoelectric conversion module, by sending air to the cooling duct 4 and by supplying high-temperature exhaust gas to the heating duct 5, a temperature difference is generated between the two ends of the thermoelectric conversion element 1. The temperature difference generates thermoelectric power in the thermoelectric conversion element 1, whereby direct current is obtained from the electrode 2. Such a thermoelectric conversion module is disclosed in Japanese Patent Application of Laid-open No. 9-293906, for example.

In general, the thermoelectric conversion module is produced by pressing and bonding the thermoelectric conversion element and the electrodes, or by bonding them with a soldering material. As described above, the thermoelectric conversion module generates power based on the thermoelectric power. The thermoelectric power occurs by the temperature difference between the two ends of the thermoelectric conversion element. Therefore, when the temperature difference between the two ends of the thermoelectric conversion element is larger, the thermoelectric power is increased, and a greater amount of electricity is generated. In order to increase the temperature difference between the two ends of the thermoelectric conversion element, the temperature of the cooling side (cooling duct 4) may be decreased, but a special device is required, which is not preferable. Accordingly, usually the temperature of the heating side (heating duct 5) is increased to not more than an upper temperature limit of the thermoelectric conversion element.

The thermoelectric conversion element and the electrode at the heating side of the thermoelectric conversion module have a bonding portion therebetween. The thermoelectric conversion element does not greatly expand with the heat, but the electrode greatly expands with the heat. Therefore, in the bonding portion, there is a difference in the amounts of the thermal expansion of the thermoelectric conversion element and the electrode. As a result, the bonding portion receives stress due to the difference in the amounts of the thermal expansion. Accordingly, when the temperature of the heating side of the thermoelectric conversion element is increased so as to increase the amount of power generation, large thermal stress occurs in the bonding portion by the difference in the amounts of the thermal expansion. The large thermal stress easily causes fracture at the bonding portion between the thermoelectric conversion element and the electrode and its vicinity.

The thermoelectric conversion element and the electrode may be bonded with a soft soldering material. In this case, if the temperature of the heating side is set to be not less than the melt temperature of the soft soldering material, the soft soldering material is melted and leaks. Therefore, in this kind of thermoelectric conversion module, the temperature of the heating side is limited, and the amount of the power generation is limited.

SUMMARY OF THE INVENTION

In view of these circumstances, an object of the present invention is to provide a thermoelectric conversion module and a production method therefor. In the thermoelectric conversion module, thermal stress occurs when it is used, but the degree of the thermal stress is decreased. Therefore, in the thermoelectric conversion module, the bonding portion between the thermoelectric conversion element and the electrode and its vicinity are prevented from fracturing. Moreover, the thermoelectric conversion module can be used at high temperatures.

The present invention provides a thermoelectric conversion module having a thermoelectric conversion element and an electrode, which are metallurgically bonded together via a porous metal layer. The porous metal layer is made of nickel or silver and has a density ratio of 50 to 90%.

In the thermoelectric conversion module of the present invention, the porous metal layer preferably has a thickness of 10 to 100 µm. In addition, the porous metal layer is preferably made by sintering metal powder particles which have an average particle diameter of 0.1 to 10 µm and are one of nickel powder particles and silver powder particles. Moreover, the thermoelectric conversion element may have an end surface that is covered with a metal, and this end surface may be bonded to the electrode via the porous metal layer.

The present invention provides a production method for a thermoelectric conversion module having a thermoelectric conversion element with an end surface and having an electrode. The production method includes preparing a paste in which metal powder particles are dispersed. The metal powder particles have an average particle diameter of 0.1 to 10 μm and are one of nickel powder particles and silver powder particles. The production method also includes applying the paste to the end surface of the thermoelectric conversion element and abutting the end surface, which is applied with the paste, to the electrode so as to connect the thermoelectric conversion element and the electrode. The production method further includes heating the paste between the thermoelectric conversion element and the electrode in an inert gas atmosphere, a reducing gas atmosphere, or a vacuum atmosphere, so as to remove the paste except for the metal powder particles and cause the metal powder particles to remain. Moreover, the production method includes sintering the remaining metal powder particles so as to form a porous metal layer and diffusion bonding the porous metal layer to the end surface of the thermoelectric conversion element and to the electrode so as to metallurgically bond them. The sintering and the diffusion bonding are simultaneously performed at a temperature of 650 to 850° C. when the nickel powder particles are used, or at a temperature of 450 to 750° C. when the silver powder particles are used.

In the production method for the thermoelectric conversion module of the present invention, the metal powder particles are preferably dispersed in the paste at 30 to 50 volume %. The paste preferably has viscosity of 10 to 100 Pa·s and preferably has a shear strength of not less than 0.1 N/cm$^2$. In addition, the end surface of the thermoelectric conversion element may be covered with a metal, and the paste may be applied to the end surface covered with the metal.

According to the thermoelectric conversion module of the present invention, the porous metal layer, which is made of nickel or silver and has a density ratio of 50 to 90%, is provided between the thermoelectric conversion element and the electrode. The porous metal layer decreases the difference in the amounts of the thermal expansion of the thermoelectric conversion element and the electrode. Therefore, the bonding portion between the thermoelectric conversion element and the electrode and its vicinity are prevented from fracturing. Since the porous metal layer is metallurgically bonded to both the thermoelectric conversion element and the electrode, heat and electricity are efficiently conducted between the thermoelectric conversion element and the electrode. Moreover, the porous metal layer made of nickel or silver has a high melting point, thereby providing a thermoelectric conversion module in which melting and leaking of the bonding portion do not occur at high temperatures.

PREFERRED EMBODIMENTS OF THE INVENTION

Figure 1:
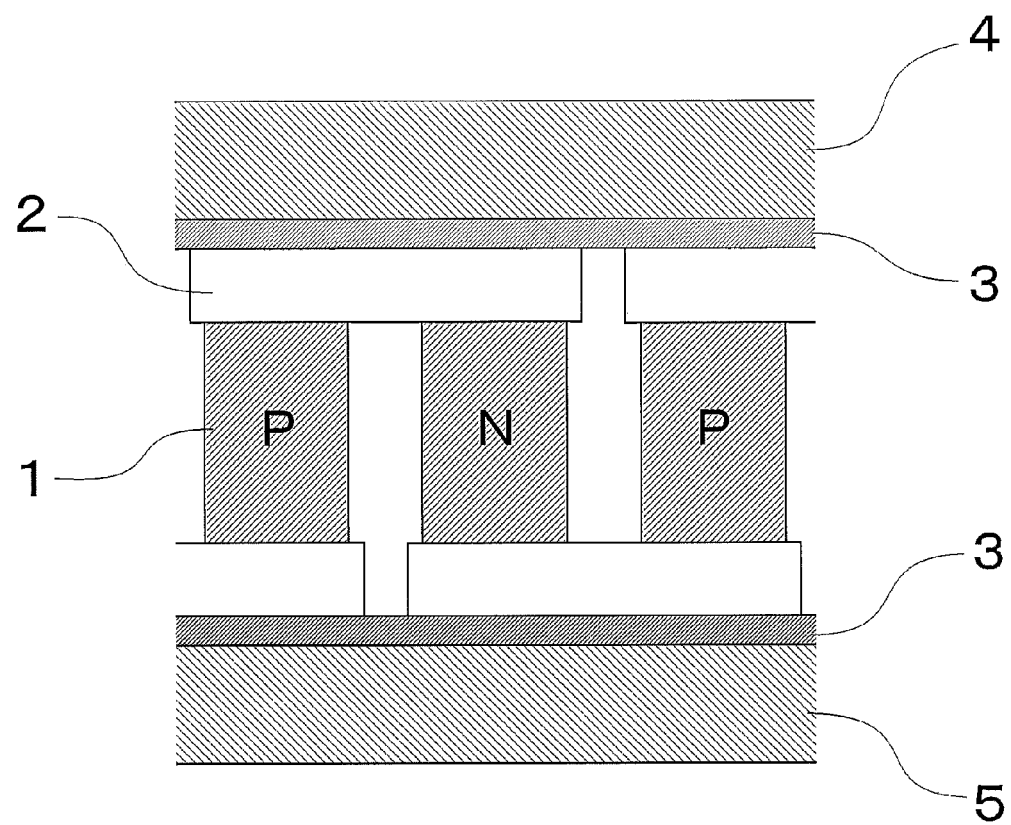
FIG. 1 is a schematic view showing an example of a thermoelectric conversion module.
Figure 2:
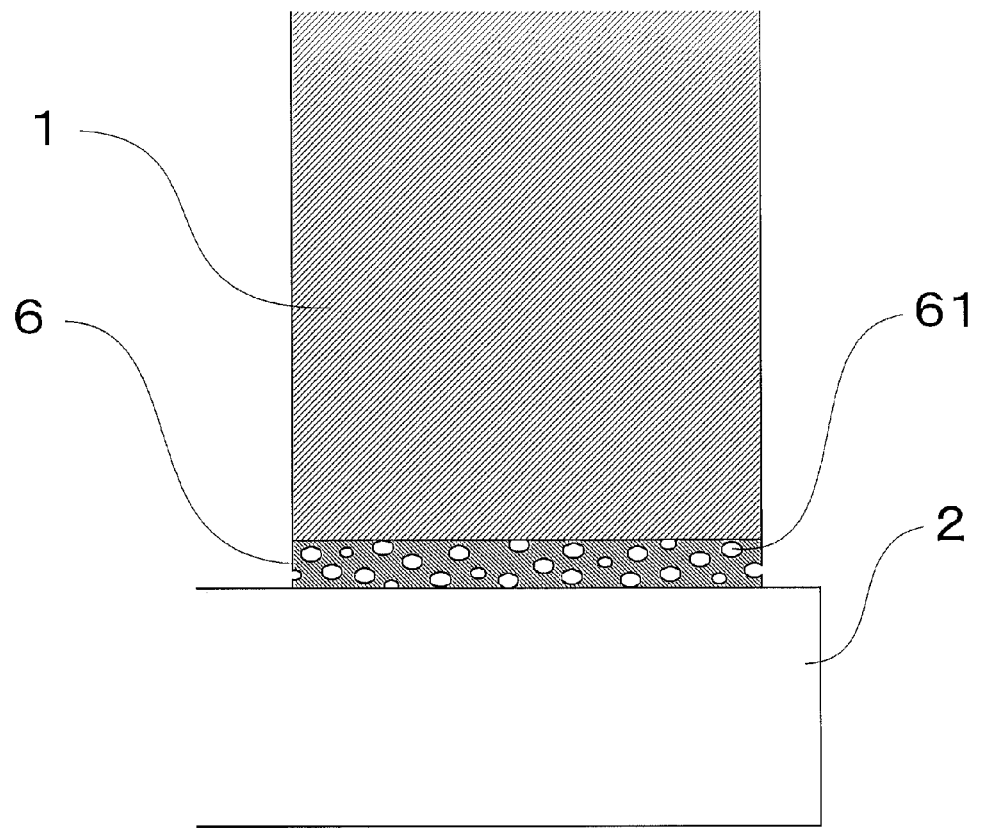
FIG. 2 is a schematic view for illustrating a thermoelectric conversion module of the present invention.

A thermoelectric conversion module of the present invention is shown in FIG. 2. As shown in FIG. 2, the thermoelectric conversion module has a thermoelectric conversion element 1, an electrode 2, and a porous metal layer 6 made of nickel or silver. The thermoelectric conversion element 1 and the electrode 2 are bonded together via the porous metal layer 6. The porous metal layer 6 includes pores 61 and is thereby easily elastically deformed. Therefore, the porous metal layer 6 decreases the difference in amounts of thermal expansion of the thermoelectric conversion element 1 and the electrode 2 by deforming. In order to obtain this effect of the porous metal layer 6, the porous metal layer 6 is made to have a density ratio of not more than 90% (porosity of not less than 10%). When the density ratio is less, the deformability of the porous metal layer 6 is increased, but the thermal conductivity and the electric conductivity are decreased. Therefore, the porous metal layer 6 is made to have a density ratio of not less than 50% (porosity of not more than 50%). Accordingly, the porous metal layer 6 is made to have a density ratio of 50 to 90%.

The composition of the porous metal layer 6 has a high melting point, that is, nickel has a melting point of 1455° C., and silver has a melting point of 962° C. Since the porous metal layer 6 is made of nickel or silver having such a high melting point, the thermoelectric conversion module can be used even at a temperature near the upper temperature limit of the thermoelectric conversion element 1. In this case, melting and leaking of the bonding material do not occur, unlike in the case of using a soft soldering material with a low melting point. The thermoelectric conversion module can be used at a temperature that does not exceed the upper temperature limit of the thermoelectric conversion element 1, whereby electricity is efficiently generated.

The porous metal layer 6 is metallurgically bonded to both the thermoelectric conversion element 1 and the electrode 2. Therefore, heat and electricity are efficiently conducted between the thermoelectric conversion element 1 and the porous metal layer 6 and between the porous metal layer 6 and the electrode 2.

The porous metal layer 6 preferably has a thickness of not less than 10 μm because the porous metal layer 6 having too small a thickness is difficult to deform. On the other hand, the porous metal layer 6 is porous, and thereby the heat conductivity and the electric conductivity are low compared with a metal layer which does not include the pores 61 and has a high density near the true density. Therefore, when the porous metal layer 6 has a large thickness, the heat conductivity and the electric conductivity between the thermoelectric conversion element 1 and the electrode 2 are decreased. Accordingly, the porous metal layer 6 preferably has a thickness of not more than 100 μm.

The porous metal layer 6 is formed by sintering the metal powder particles of one of the nickel powder particles and the silver powder particles. In this case, if the metal powder particles are singly dispersed and form one layer, the porous metal layer 6 is difficult to elastically deform. Therefore, the porous metal layer 6 is preferably formed by sintering the metal powder particles that are laminated. From this point of view, the porous metal layer 6 is preferably formed by sintering fine metal powder particles with an average particle diameter of not more than 10 μm. The average particle diameter is a median diameter (particle diameter at 50% of a cumulative distribution). If extremely fine metal powder particles are used, the porous metal layer 6 is greatly densified in the sintering, and the density ratio tends to exceed 90%. Therefore, it is preferable to use metal powder particles having an average particle diameter of not less than 0.1 μm. In order to make the porous metal layer 6 have a thickness of 10 μm, the average particle diameter of the metal powder particles is preferably set so that the metal powder particles form plural layers. Although the average particle diameter is in the range of 0.1 to 10 μm, the thickness of the porous metal layer 6 is difficult to control if the metal powder particles include large powder particles. Therefore, it is preferable to use metal powder particles having a maximum particle diameter of not more than 30 µm.

In order to decrease the thermal stress, the pores 61 dispersed in the porous metal layer 6 preferably have approximately spherical shapes. In the present invention, since the fine metal powder particles are used as described above, the sintering actively proceeds, and the pores 61 are formed into approximately spherical shapes.

The porous metal layer 6 may be formed as follows. First, a sintered compact is prepared by sintering the metal powder particles of one of the nickel powder particles and the silver powder particles. The sintered compact is held and is arranged between the thermoelectric conversion element 1 and the electrode 2, and they are diffusion bonded by pressing and heating. In this case, since the metal powder particles are once sintered into a sintered compact, the metal powder particles are difficult to be dispersed to the thermoelectric conversion element 1 and the electrode 6. Accordingly, the porous metal layer 6 is preferably formed by the following manner. One of the nickel powder particles and the silver particle powders in the form of metal powder particles are arranged to an end surface of the thermoelectric conversion element 1 or to a portion of the electrode 2, which is to be connected to the thermoelectric conversion element 1. Then, the metal powder particles are sintered and are simultaneously diffusion bonded to both the thermoelectric conversion element 1 and the electrode 2.

In order to arrange one of the nickel powder particles and the silver powder particles to the end surface of the thermoelectric conversion element 1 or to the portion of the electrode 2, a paste is preferably used. In the paste, the metal powder particles having the above particle diameter are dispersed. The paste may include at least one of a dispersing agent, an adhesive agent, a viscosity modifier, and the like. In addition, the paste may also include resin of monomer. By using the paste, the metal powder particles are easily arranged to the end portion of the thermoelectric conversion element 1 or to the portion of the electrode 2. In this case, first, a paste, in which the metal powder particles with the above particle diameter are dispersed, is prepared. This paste is applied to an end surface of the thermoelectric conversion element 1, and then the end surface is abutted to the electrode 2. Accordingly, the paste is held and is arranged between the thermoelectric conversion element 1 and the electrode 2. Then, the set of the thermoelectric conversion element 1, the paste, and the electrode 2, is heated in an inert gas atmosphere, a reducing gas atmosphere, or a vacuum atmosphere, so as to remove the paste except for the metal powder particles. Thus, the metal powder particles of one of the nickel powder particles and the silver powder particles are arranged between the thermoelectric conversion element 1 and the electrode 2.

The paste may be applied to the portion of the electrode 2, and the thermoelectric conversion element 1 may be abutted to this portion. Then, the set of the thermoelectric conversion element 1, the paste, and the electrode 2, is heated so as to remove the paste except for the metal powder particles, as described above.

After the paste is arranged between the thermoelectric conversion element 1 and the electrode 2, the paste may be volatilized or be dried so as to solidify. Then, the set of the thermoelectric conversion element 1, the paste, and the electrode 2, is heated so as to remove the paste except for the metal powder particles.

After the paste, except for the metal powder particles, is removed by heating, the metal powder particles may be cooled and be sintered later. In this condition, the metal powder particles are not sintered and thereby easily fall apart. Therefore, the metal powder particles are preferably continuously heated and sintered so as to form the porous metal layer 6. Simultaneously, the porous metal layer 6 is diffusion bonded to the end surface of the thermoelectric conversion element 1 and to the electrode 2 so as to metallurgically bond them. In this case, the metal powder particles do not fall apart, and energy for reheating is saved.

The sintering and the diffusion bonding are performed at a temperature of 650 to 850° C. when the nickel powder particles are used as the metal powder particles. On the other hand, the sintering and the diffusion bonding are performed at a temperature of 450 to 750° C. when the silver powder particles are used as the metal powder particles. The sintering and the diffusion bonding are performed without applying pressure. The metal powder particles of one of the nickel powder particles and the silver powder particles having an average particle diameter of 0.1 to 10 µm are used. Such a fine powder has a large surface area and is easily sintered. Therefore, even when the pressure is not applied, the metal powder particles are sintered and are diffusion bonded to the thermoelectric conversion element 1 and to the electrode 2. By performing the sintering and the diffusion bonding at not less than 650° C. in the case of using the nickel powder particles and at not less than 450° C. in the case of using the silver powder particles, the density ratio of the metal powder 6 becomes not less than 50%. Thus, a porous metal layer 6 is obtained, and the porous metal layer 6 sufficiently decreases the thermal stress when used in the thermoelectric conversion module. In contrast, since the fine powder is easily sintered, if the sintering is performed at more than 850° C. in the case of using the nickel powder particles and at more than 750° C. in the case of using the silver powder particles, the porous metal layer 6 is greatly densified, and the density ratio becomes greater than 90%.

As described above, the sintering and the diffusion bonding are performed without applying pressure, but may be performed by applying pressure of not more than 1 MPa. When the sintering is performed by applying pressure, the thermoelectric conversion element 1, the electrode 2, and the metal powder particles arranged therebetween, are closely contacted, whereby the diffusion bonding is easily performed. The thermoelectric conversion module includes plural thermoelectric conversion elements 1 that have variation in height. However, by sintering and applying pressure, the metal powder particles absorb the variations of the heights of the thermoelectric conversion elements 1 and form the porous metal layer 6. Therefore, a thermoelectric conversion module, in which the distances between the electrodes 2 are the same, is produced. In this case, the metal powder particles are brought into close contact with each other and are easily sintered, whereby the density ratio of the porous metal layer 6 is increased. Accordingly, in a case of performing the sintering by applying pressure, the pressure should be not greater than 1 MPa.

If a paste including a small amount of the metal powder particles is used, the amount of the metal powder particles applied at one time is small. Therefore, in order to arrange a necessary amount of the metal powder particles between the thermoelectric conversion element 1 and the electrode 2, the paste must be applied several times. In contrast, if the paste includes an excessive amount of the metal powder particles, components other than the metal powder particles in the paste are relatively decreased. Therefore, the fluidity of the paste is decreased, and the paste is difficult to adhere, and the paste is therefore difficult to use. In view of this, the nickel powder particles or the silver powder particles are preferably dispersed in the paste at 30 to 50 volume %. By using such a paste, the necessary amount of the metal powder particles is easily applied at one time.

If a paste having low viscosity is used, the amount of the paste applied at one time is small, whereby the paste must be applied several times in order to make the porous metal layer 6 with a predetermined thickness. Moreover, the paste may leak from the predetermined position and may hang down. On the other hand, if the paste has very high viscosity, the paste is difficult to use. Moreover, the amount of the paste applied at one time is increased, which may cause a removing process of the extra amount of the paste after the application. From this point of view, the paste is preferably adjusted so as to have a viscosity of 10 to 100 Pa·s.

The paste preferably adheres in order to prevent slip of the thermoelectric conversion element 1 and the electrode 2 after they are assembled together. Accordingly, the assembled thermoelectric conversion element 1 and the electrode 2 are easily handled until the sintering. In this case, the paste has only to temporarily adhere the electrode 2 to the thermoelectric conversion element 1 until the diffusion bonding in the sintering. Therefore, a paste with a shear strength of approximately not less than $0.1$ $N/cm^2$ is sufficient to prevent the slip in the handling.

The paste may include an adhesive material and may be hardened after the paste is applied. In this case, the electrode 2 is securely fixed (adhered) to the thermoelectric conversion element 1 by the hardened paste, whereby they are easily handled.

According to the above production method, a thermoelectric conversion module can be easily obtained by a few steps using a small amount of energy. The thermoelectric conversion module has the thermoelectric conversion element 1 and the electrode 2 that are metallurgically bonded together via the porous metal layer 6 with a density ratio of 50 to 90%.

The porous metal layer 6 is provided at least between the thermoelectric conversion element 1 and the electrode 2 at the side of the heating duct 5. The porous metal layer 6 may be provided to both end portions of the thermoelectric conversion element 1. Nevertheless, when the temperature of the end portion of the thermoelectric conversion element 1 at the side of the cooling duct 4 is low so that it does not cause leak of a soldering material, the thermoelectric conversion element 1 and the electrode 2 can be bonded together by a conventional soldering material.

In the thermoelectric conversion module of the present invention, a thermoelectric conversion element having a high upper temperature limit is suitably used. For example, a thermoelectric conversion element made of an alloy such as of the silicon-germanium type, magnesium-silicon type, manganese-silicon type, or iron-silicide type, may be used. On the other hand, a thermoelectric conversion element having a low upper temperature limit is not suitably used because the upper temperature limit of the element is lower than the temperatures at the sintering and at the diffusion bonding. The thermoelectric conversion element having a low upper temperature limit is made of an alloy such as of the bismuth-tellurium type, lead-tellurium type, or iron-vanadium-aluminum type, for example.

One of the thermoelectric conversion elements having a high upper temperature limit, for example, a thermoelectric conversion element made of iron silicide is known to have the following negative influence. When this thermoelectric conversion element is brought into direct contact with a copper electrode, copper is diffused from the copper electrode into the thermoelectric conversion element. As a result, erosion of the copper electrode occurs, and the thermoelectric conversion element is deteriorated, whereby electricity is not generated. However, by arranging the porous metal layer 6 between the thermoelectric conversion element and the electrode, the metal layer of the nickel or the silver prevents the copper from diffusing from the copper electrode.

In the thermoelectric conversion module of the present invention, the end surface of the thermoelectric conversion element 1 may be covered with a metal beforehand, and the paste may be applied to the end surface covered with the metal. Then, the paste, except for the metal powder particles, is removed, and sintering of the metal powder particles and diffusion bonding of the porous metal layer 6 to the thermoelectric conversion element 1 and to the electrode 2 are performed.

The end surface of the thermoelectric conversion element 1 may be covered with the metal by plating, vapor deposition, sputtering, or thermal spraying. When the end surface of the thermoelectric conversion element 1 is covered by one of these methods, the end surface of the thermoelectric conversion element 1 is smoothed. Therefore, the area of the metal powder particles contacting the end surface of the thermoelectric conversion element 1 is increased. Accordingly, when the metal powder particles are sintered and are diffusion bonded to the thermoelectric conversion element 1, the porous metal layer 6 is easily diffusion bonded to the end surface of the thermoelectric conversion element 1.

A metal such as nickel, iron, silver, or cobalt, which can be suitably diffusion bonded to the nickel or the silver, is preferably used as the metal for covering the end surface of the thermoelectric conversion element 1. In this case, the porous metal layer 6 and the thermoelectric conversion element 1 are strongly bonded together by diffusion bonding.

In a case of using a thermoelectric conversion element 1 that actively reacts with nickel, a metal such as iron, silver, or cobalt, may be used as the metal for covering the end surface of the thermoelectric conversion element 1. This metal functions as a barrier layer and prevents the nickel from diffusing from the porous metal layer 6 to the thermoelectric conversion element 1. Therefore, deterioration of the thermoelectric conversion element 1 is prevented. Accordingly, the material of the thermoelectric conversion element 1 can be selected from various materials.

EXAMPLES

First Example

Nickel powder particles having an average particle diameter of 1 μm and a maximum particle diameter of not more than 10 μm were prepared. Then, 35 volume % of the nickel powder particles were dispersed in normal methyl pyrolidone including 8 volume % of hydroxyl propyl cellulose, whereby a paste was prepared. The paste had a viscosity of approximately 40 Pa·s. The paste was applied to both end surfaces of a thermoelectric conversion element made of silicon germanium. The both end surfaces of the thermoelectric conversion element were abutted with electrodes made of molybdenum. Then, the paste was arranged between the thermoelectric conversion element and the electrode, whereby a thermoelectric conversion module was assembled. A weight of 50 g (corresponding to 1 kPa) was applied to the thermoelectric conversion module and it was placed in a sintering furnace. The thermoelectric conversion module was heated at 500° C. in a hydrogen gas atmosphere so as to remove the paste except for the metal powder particles. Moreover, the thermoelectric conversion module was heated to a temperature shown in Table 1 so as to sinter and diffusion bond the metal powder particles. Accordingly, two sets of samples of thermoelectric conversion modules of sample Nos. 01 to 07 were made.

One set of the thermoelectric conversion modules was cut in a direction perpendicular to the bonding surface, and each of the sectional metallic structures was observed by microscope. Thus, bonding condition of the interface between the porous metal layer and the thermoelectric conversion element and bonding condition of the interface between the porous metal layer and the electrode were investigated. The metal structure was photographed at 500-times magnification, and this image was analyzed by using image analyzing software ("Win ROOF" produced by Mitani Corporation), whereby density ratio of the porous metal layer was measured. These results are also shown in Table 1. Table 1 shows results of the evaluation of the bonding conditions before the heat test. In Table 1, the mark "O" indicates a sample which had not less than 50% of a metallurgically bonded portion at the interface, and the mark "x" indicates a sample which had less than 50% of the metallurgically bonded portion at the interface.

In the samples having the mark "O" in the microscope observation, a heat test was performed by using the other set of the samples. The heat test was performed such that one of the electrodes was maintained at 550° C. and the other electrode was heated to 20° C. for 24 hours. Then, the sample was cut in the direction perpendicular to the bonding surface, and the sectional metallic structure was observed by a microscope. Thus, the bonding portion of the porous metal layer and the thermoelectric conversion element and the bonding portion of the porous metal layer and the electrode were investigated. These results are also shown in Table 1. The bonding conditions after the heat test were evaluated as in the case of the evaluation of the bonding conditions before the heat test.

TABLE 1

| Sample No. | Sintering temperature ° C. | Density ratio of porous metal layer % | Bonding condition Before heat test | Bonding condition After heat test |
|---|---|---|---|---|
| 01 | 600 | 46 | x | — |
| 02 | 650 | 50 | o | o |
| 03 | 700 | 58 | o | o |
| 04 | 750 | 76 | o | o |
| 05 | 800 | 86 | o | o |
| 06 | 850 | 90 | o | o |
| 07 | 1000 | 97 | o | x |

As shown in Table 1, in the sample of the sample No. 01 that was sintered at less than 650° C., the sintering did not proceed sufficiently. Therefore, the density ratio of the porous metal layer was less than 50%, and the thermoelectric conversion element and the porous metal layer, and the electrode and the porous metal layer, were insufficiently bonded. According to the increase of the sintering temperature, the sintering was accelerated, whereby the density ratio of the porous metal layer was increased. In the sample of the sample No. 02 that was sintered at 650° C., the sintering proceeded sufficiently. Therefore, the density ratio of the porous metal layer was 50%, and the thermoelectric conversion element and the porous metal layer, and the electrode and the porous metal layer, were sufficiently bonded together. Moreover, the pores of the porous metal layer decreased the thermal stress, whereby the bonding condition of the thermoelectric conversion element and the porous metal layer and the bonding condition of the electrode and the porous metal layer were maintained after the heat test.

Figure 3:
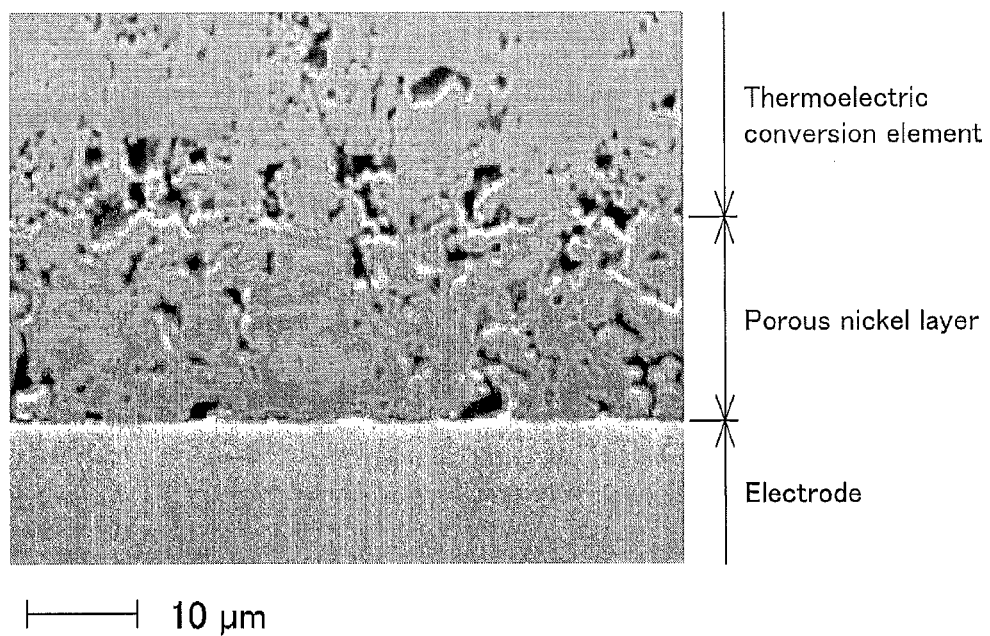
FIG. 3 is a SEM image of a bonding portion of a thermoelectric conversion module of the present invention.

FIG. 3 is a SEM image of the bonding portion of the sample of the sample No. 04. As shown in FIG. 3, the nickel powder particles in the form of the paste arranged between the thermoelectric conversion element and the electrode were sintered and formed a porous metal layer. The porous metal layer was metallurgically bonded to the thermoelectric conversion element and to the electrode. By forming such a porous metal layer, even when the bonding surface of the thermoelectric conversion element and the electrode is applied with thermal stress, the pores of the porous metal layer decrease the thermal stress, and good bonding condition is maintained.

On the other hand, in the sample of the sample No. 07 that was sintered at more than 850° C., the sintering proceeded excessively, whereby the density ratio of the porous metal layer was greater than 90%. In this sample, the bonding condition after the sintering was good, but the bonding surface was fractured by the heat test. That is, since the amount of the pores was small, the thermal stress was not sufficiently decreased.

According to these results, when the density ratio of the porous metal layer was 50 to 90%, the thermal stress was sufficiently decreased, and good bonding condition was maintained. In addition, by performing the sintering at 650 to 850° C., the above density ratio was obtained.

Second Example

The thermoelectric conversion element used in the First Example was changed to a thermoelectric conversion element made of $Mg_2Si$, in which both end surfaces were covered with nickel. This thermoelectric conversion element was prepared as follows. First, a bulk sintered compact made of $Mg_2Si$ was prepared. The bulk sintered compact was plated with nickel and was cut into the shape of the thermoelectric conversion element. Then, a thermoelectric conversion module was made and was evaluated as in the case of the First Example. As a result, although the thermoelectric conversion element was changed, when the density ratio of the porous metal layer was 50 to 90%, the thermal stress was sufficiently decreased, and good bonding condition was maintained. In addition, by performing sintering at 650 to 850° C., the above density ratio was obtained.

Third Example

Several kinds of nickel powder particles having an average particle diameter shown in Table 2 were prepared, and pastes were made as in the case of the First Example. Then, thermoelectric conversion modules were assembled by using the pastes as in the case of the First Example. The thermoelectric conversion modules were sintered at 800° C. so as to remove the paste except for the metal powder particles, and to sinter and diffusion bond the metal powder particles as in the case of the First Example. Accordingly, two sets of samples of the thermoelectric conversion modules of the sample Nos. 08 to 13 were prepared. In these samples, the density ratio of the porous metal layer was measured, and the bonding portion before and after the heat test was evaluated. These results are also shown in Table 2.

TABLE 2

| Sample No. | Metal powder particles μm Average particle size | Maximum particle size | Density ratio of porous metal layer % | Bonding condition Before heat test | After heat test |
|---|---|---|---|---|---|
| 08 | 0.01 | 10.0 | 96 | ○ | x |
| 09 | 0.1 | 10.0 | 90 | ○ | ○ |
| 10 | 0.5 | 10.0 | 88 | ○ | ○ |
| 05 | 1.0 | 10.0 | 86 | ○ | ○ |
| 11 | 5.0 | 20.0 | 66 | ○ | ○ |
| 12 | 10.0 | 30.0 | 50 | ○ | ○ |
| 13 | 20.0 | 30.0 | 44 | x | — |

As shown in Table 2, when the average particle diameter of the metal powder particles was smaller, the surface area was greater, and thereby the sintering proceeded actively, whereby the porous metal layer was densified, and the density ratio was increased. In other words, when the average particle diameter of the metal powder particles was greater, the porous metal layer was difficult to be densified in the sintering, whereby the density ratio of the porous metal layer was smaller.

In the sample of the sample No. 08, the metal powder particles had an average particle diameter of less than 0.1 μm, and the amount of the fine powder particles was excessive, whereby the surface area was too great. Therefore, the sintering proceeded extremely actively, and the density ratio of the porous metal layer was greater than 90%, and the porosity was less than 10% and was small. Accordingly, the interface was fractured by the thermal stress due to the thermal expansions of the thermoelectric conversion element and the electrode in the heat test, and the bonding condition was not good after the heat test. In contrast, in the sample of the sample No. 09, the metal powder particles had an average particle diameter of 0.1 μm, whereby the density ratio of the porous metal layer was 90%, and a sufficient amount of the pores were dispersed. Therefore, the thermal stress was decreased by the pores in the heat test, and good bonding condition was maintained after the heat test. On the other hand, in the sample of the sample No. 13, the metal powder particles had an average particle diameter of greater than 10 μm, and the sintering did not proceed sufficiently. Therefore, the density ratio of the porous metal layer was less than 50%, and the thermoelectric conversion element and the porous metal layer, and the electrode and the porous metal layer, were not sufficiently bonded together.

According to these results, by using the metal powder particles having an average particle diameter of 0.1 to 10 μm, the density of the porous metal layer was made to be 50 to 90%, and good bonding condition was obtained.

Fourth Example

The thermoelectric conversion element used in the Third Example was changed to the thermoelectric conversion element made of Mg$_2$Si, which was covered with nickel and was used in the Second Example. Then, a thermoelectric conversion module was made and was evaluated as in the case of the Third Example. As a result, although the kind of the thermoelectric conversion element was changed, by using the metal powder particles having an average particle diameter of 0.1 to 10 μm, the density ratio of the porous metal layer was made to be 50 to 90%, and good bonding condition was obtained.

The thermoelectric conversion module of the present invention has the porous metal layer that decreases the thermal stress occurring at high temperatures. Therefore, the thermoelectric conversion module can be used at high temperatures at which the function of the thermoelectric conversion element is most effectively used, whereby a greater amount of electricity is generated. Accordingly, the thermoelectric conversion module of the present invention is suitably used for a small-scale distributed power generation system using an exhaust source of a waste incinerator, a cogeneration system, etc. Moreover, the thermoelectric conversion module of the present invention is suitably used for an automobile power generation system using the heat in the exhaust gas of automobiles.

What is claimed is:

1. A production method for a thermoelectric conversion module having a thermoelectric conversion element with an end surface and having an electrode, the production method comprising:
    preparing a paste in which nickel powder particles are dispersed, the nickel powder particles having an average particle diameter of 0.1 to 10 μm;
    applying the paste to the end surface of the thermoelectric conversion element;
    abutting the end surface, to which the paste is applied, to the electrode so as to connect the thermoelectric conversion element and the electrode;
    heating the paste between the thermoelectric conversion element and the electrode in an inert gas atmosphere, a reducing gas atmosphere, or a vacuum atmosphere, so as to remove the paste except for the nickel powder particles and cause the nickel powder particles to remain;
    sintering the remaining nickel powder particles so as to form a porous nickel layer; and
    diffusion bonding the porous nickel layer to the end surface of the thermoelectric conversion element and to the electrode so as to metallurgically bond them,
    wherein the sintering and the diffusion bonding are simultaneously performed at a temperature of 650 to 850° C.

2. The production method for the thermoelectric conversion module according to claim 1, wherein the nickel powder particles are dispersed in the paste at 30 to 50 volume %.

3. The production method for the thermoelectric conversion module according to claim 1, wherein the paste has a viscosity of 10 to 100 Pa·s.

4. The production method for the thermoelectric conversion module according to claim 1, wherein the paste has a shear strength of not less than 0.1 N/cm$^2$.

5. The production method for the thermoelectric conversion module according to claim 1, wherein the end surface of the thermoelectric conversion element is covered with a metal, and the paste is applied to the end surface covered with the metal.

6. The production method for the thermoelectric conversion module according to claim 1, wherein the porous nickel layer has a density ratio of 50 to 90%.

7. The production method for the thermoelectric conversion module according to claim 1, wherein the porous nickel layer has a thickness of 10 to 100 μm.

8. The production method for the thermoelectric conversion module according to claim 1, wherein the sintering and the diffusion bonding are performed without applying pressure, or are performed by applying pressure of not more than 1 Mpa.

* * * * *